United States Patent
Tsukamoto

(10) Patent No.: US 9,371,578 B2
(45) Date of Patent: Jun. 21, 2016

(54) TANTALUM COIL FOR SPUTTERING AND METHOD FOR PROCESSING THE COIL

(75) Inventor: Shiro Tsukamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 423 days.

(21) Appl. No.: 13/581,843

(22) PCT Filed: Mar. 14, 2011

(86) PCT No.: PCT/JP2011/055916
§ 371 (c)(1),
(2), (4) Date: Aug. 30, 2012

(87) PCT Pub. No.: WO2011/122317
PCT Pub. Date: Oct. 6, 2011

(65) Prior Publication Data
US 2012/0318668 A1    Dec. 20, 2012

(30) Foreign Application Priority Data

Mar. 29, 2010   (JP) .................................. 2010-075373

(51) Int. Cl.
C23C 14/34    (2006.01)
C23C 14/56    (2006.01)
H01J 37/34    (2006.01)

(52) U.S. Cl.
CPC ............. *C23C 14/564* (2013.01); *C23C 14/34* (2013.01); *H01J 37/34* (2013.01)

(58) Field of Classification Search
CPC .......................... C23C 14/564; C23C 14/3471
USPC ................................................... 204/298.11
See application file for complete search history.

(56) References Cited

U.S. PATENT DOCUMENTS

| | | | |
|---|---|---|---|
| 4,402,359 A * | 9/1983 | Carnavos et al. ................ 165/70 |
| 5,474,649 A | 12/1995 | Kava et al. | |
| 6,045,665 A | 4/2000 | Ohhashi et al. | |
| 6,162,297 A * | 12/2000 | Mintz et al. .................... 118/715 |
| 6,165,274 A * | 12/2000 | Akiyama et al. ............... 118/724 |
| 6,315,872 B1 | 11/2001 | Pavate et al. | |
| 6,319,419 B1 | 11/2001 | Ohhashi et al. | |
| 6,376,807 B1 | 4/2002 | Hong et al. | |
| 6,503,380 B1 * | 1/2003 | Buehler ................... 204/298.12 |
| 6,506,312 B1 | 1/2003 | Bottomfield | |
| 6,812,471 B2 | 11/2004 | West et al. | |
| 2002/0043466 A1* | 4/2002 | Dordi .................... C23C 18/165 205/123 |
| 2004/0206804 A1* | 10/2004 | Kim .................... C23C 14/3407 228/199 |
| 2005/0082258 A1 | 4/2005 | Kim | |
| 2006/0213769 A1 | 9/2006 | Lee et al. | |

(Continued)

*Primary Examiner* — John Brayton
(74) *Attorney, Agent, or Firm* — Howson & Howson LLP

(57) ABSTRACT

Provided is a tantalum coil for sputtering disposed between a substrate and a sputtering target, wherein the tantalum coil has irregularities so that the surface roughness Rz of the tantalum coil is 150 μm or more and the number of threads is 15 to 30 TPI (Threads per inch) in a transverse direction and 10 to 30 TPI in a vertical direction. An object of the present invention is to take measures to prevent the sputtered grains accumulated on the surface of a tantalum coil from flaking so as to prevent the generation of particles and arcing that is caused by the flaking of the sputtered grains accumulated on the surface of the coil disposed between a substrate and a sputtering target, and the adhesion of the scattered flakes onto the substrate surface; and thereby to provide a technology of improving the quality and productivity of electronic components and stably providing semiconductor elements and devices.

4 Claims, 4 Drawing Sheets

Mighty knurling

(A)

(B)

Outside wall

(56) References Cited

U.S. PATENT DOCUMENTS

| | | |
|---|---|---|
| 2008/0183257 A1 | 7/2008 | Imran et al. |
| 2009/0194414 A1 | 8/2009 | Nolander et al. |
| 2013/0112556 A1 | 5/2013 | Nagata et al. |
| 2014/0174917 A1 | 6/2014 | Tsukamoto |

* cited by examiner

Mighty knurling (A)

(B)

Outside wall

Comparison between conventional and improved Knurling

| | Mighty knurling |
|---|---|
| Surface image | (A)  |
| Cross sectional image | (B)  |
| Surface roughness | Ry= 250um |

Conventional knurling (A)

(B)

Outside wall

Comparison between conventional and improved Knurling

| | Conventional knurling |
|---|---|
| Surface image | (A)  |
| Cross sectional image | (B)  |
| Surface roughness | Ry=70~80um |

Cross section          Surface (B)          (A)

TANTALUM COIL FOR SPUTTERING AND METHOD FOR PROCESSING THE COIL

BACKGROUND

The present invention relates to a tantalum coil for sputtering capable of effectively inhibiting the flaking of sputtered grains accumulated on the surface of a coil that is used in a sputtering device so as to prevent the flakes of such sputtered grains from causing the generation of particles and arcing, and to the method for processing such a coil.

This tantalum coil for sputtering has a curved surface as shown in the diagrams below, and the surface of the coil covers both the inner surface and the outer surface. Accordingly, the expression "surface of the coil" refers to both the inner surface and the outer surface of the coil, and the same shall apply hereinafter.

In recent years, the sputtering method that is capable of easily controlling the film thickness and components is commonly used as one of the methods for depositing materials for use in electronic and electrical components.

The sputtering method employs a principle where: a positive electrode and a negative-electrode target are placed opposite each other; an electric field is generated by applying high voltage between the substrate and the target under an inert gas atmosphere; electrons ionized when the electric field is generated collide with the inert gas to form plasma; the positive ions in this plasma collide with the target (negative electrode) surface to discharge the constituent atoms of the target; and the extruded atoms adhere to the opposing substrate surface to form a film.

As recent sputtering technology, there is a technique of disposing a coil between the sputtering target and the substrate to increase the density of the plasma and to lead as much as possible the flying sputtered grains ballistically toward the substrate. Consequently, the sputtering rate is increased, the uniformity of the film is improved, and the quality of the film that is deposited on the substrate can be comprehensively improved.

There are cases where the material of this coil is sputtered, some are not. It depends on the bias to the coil (refer to Patent Documents 1 and 2).

Accordingly, as the material of the coil, generally used is the same material as the target material, or a material configuring a part of the materials of the sputtered film that is deposited on the substrate. Nevertheless, there is no particular limitation so as long as the coil material does not contaminate the thin film on the substrate. Moreover, as the shape of the coil, there are circular coils and spiral coils (refer to Patent Documents 1, 2, and 3), and there are cases where these coils are disposed in multiple stages.

A problem upon forming a thin film via the foregoing sputtering method is the generation of particles. Generally speaking, the sputtered grains might also be accumulated, other than on the substrate, anywhere such as on the inner wall of the thin-film deposition system or on the internal elements therein. The sputtered grains may be accumulated on the surface other than the eroded portion, or the side surface, of the target. The particles are generated partly because the flakes from the components and the like inside the thin-film deposition system become scattered and adhere onto the substrate surface.

Recently, while the integration of LSI semiconductor devices is increasing (16 Mb, 64 Mb and even 256 Mb), the miniaturization thereof is also improved by decreasing the line width to be 0.25 μm or less. Thus, problems of the disconnection or short-circuiting of the wiring caused by the foregoing particles now occur even more frequently.

Thus, the generation of particles is becoming an even bigger problem while the electronic device circuit continues to be further integrated and miniaturized.

However, when disposing the foregoing coil between a target and a substrate so as to increase the density of the plasma and lead as much as possible the flying sputtered grains ballistically toward the substrate, the amount of sputtered grains that will scatter and adhere, not onto the substrate, but to the inner wall of the thin-film deposition system or to the internal elements therein will decrease; but there is a problem in that the sputtered grains become accumulated on the coil itself.

In order to avoid this kind of problem, Patent Document 3 proposes that the upper end of the inner surface side of the coil is scraped off so as to reduce the thickness of the inner periphery. Here, the provided explanation is that the deposited material to become accumulated at the top of the coil slips off without remaining thereon since the shape of the upper end of the coil becomes sharper toward the top, and the coil is further cleansed since new sputtered grains will collide therewith.

Nevertheless, the portion where the deposited material will accumulate due to sputtering is not limited to the upper end of the coil. There is a possibility that the sputtered grains will also become accumulated on the surface of the coil; that is, on the outer surface and the inner surface of the coil. In the foregoing case, the flakes from the surface of the coil, where the sputtered grains have accumulated, adhere directly to the substrate surface and cause the generation of particles, but no measures are taken for this problem. Based on the demands of higher integration and further miniaturization of the circuit of electronic device, the generation of particles from the foregoing locations will also become a major problem.

In order to resolve the foregoing problem, a proposal has been made to treat the side face of the target and the vicinity of the backing plate via blasting so as to increase the adhesion based on the anchor effect.

Nevertheless, in the foregoing case, there are the following problems; namely, contamination of the product caused by the residual blasting material, flaking of the grains that were accumulated on and adhered to the residual blasting material, and the flaking caused by the selective and non-uniform growth of the adhesive film; and therefore the foregoing blasting is not a final solution. When the coil is particularly made of a hard material like tantalum, it is difficult to even form irregularities by simply performing blasting, and it is not possible to effectively increase the adhesion.

Moreover, Patent Document 4 discloses forming, via knurling, a diamond-shaped or cross-hatch (net-like) pattern on the flange, side wall, shield, covering and the like of a target. Here, the depth is roughly 0.350 mm to 1.143 mm, but since the irregularities on the worked surface are of a simple shape, there is a possibility that a sufficient anchor effect cannot be obtained.

[Patent Document 1] Published Japanese Translation No. 2005-538257 of PCT Application
[Patent Document 2] Japanese Laid-Open Patent Publication No. 2001-214264
[Patent Document 3] Published Japanese Translation No. 2008-534777 of PCT Application
[Patent Document 4] WO2009/099775 (PCT/US2009/031777)

SUMMARY OF INVENTION

An object of the present invention is to take measures to prevent the sputtered grains accumulated on the surface of a tantalum coil from flaking so as to prevent the generation of particles and arcing that is caused by the flaking of the sputtered grains accumulated on the coil disposed between a substrate and a sputtering target, and the adhesion of the scattered flakes onto the substrate surface; and thereby to provide a technology of improving the quality and productivity of electronic components and stably providing semiconductor elements and devices.

Based on the above, the present invention provides:

1) A tantalum coil for sputtering disposed between a substrate and a sputtering target, wherein the tantalum coil has irregularities so that the surface roughness Rz of the tantalum coil is 150 μm or more and the number of threads is 15 to 30 TPI (TPI stands for "Threads per inch"; hereinafter indicated as "TPI") in a transverse direction and 10 to 30 TPI in a vertical direction;

2) The tantalum coil for sputtering according to 1) above, wherein the surface roughness Rz is 200 μm or more;

3) The tantalum coil for sputtering according to 1) above, wherein the surface roughness Rz is 250 μm or more; and 4) The tantalum coil for sputtering according to any one of 1) to 3) above, wherein the thread crest R is 10 to 500 μm or the thread crest is provided with a flat having a width of 10 to 500 μm.

Note that the foregoing TPI (Threads per inch) refers to the number of threads (number of screw threads) per inch (25.4 mm).

The present invention additionally provides:

5) A method for processing a tantalum coil for sputtering, wherein irregularities are formed by performing knurling to a tantalum coil disposed between a substrate and a sputtering target so that the surface roughness Rz of the tantalum coil is 150 μm or more and the number of threads is 15 to 30 TPI in a transverse direction and 10 to 30 TPI in a vertical direction;

6) The method for processing a tantalum coil for sputtering according to 5) above, wherein the surface roughness Rz is 200 μm or more;

7) The method for processing a tantalum coil for sputtering according to 5) above, wherein the surface roughness Rz is 250 μm or more; and 8) The method for processing a tantalum coil for sputtering according to any one of 5) to 7) above, wherein the thread crest R is 10 to 500 μm or the thread crest is provided with a flat having a width of 10 to 500 μm.

The present invention is thereby able to effectively prevent the sputtered grains accumulated on the surface of a tantalum coil from flaking so as to prevent the generation of particles and arcing that is caused by the flaking of the sputtered grains accumulated on the surface of the coil disposed between a substrate and a sputtering target, and the adhesion of the scattered flakes onto the substrate surface; and to provide a technology of improving the quality and productivity of electronic components and stably providing semiconductor elements and devices.

DETAILED DESCRIPTION

Figure 1:
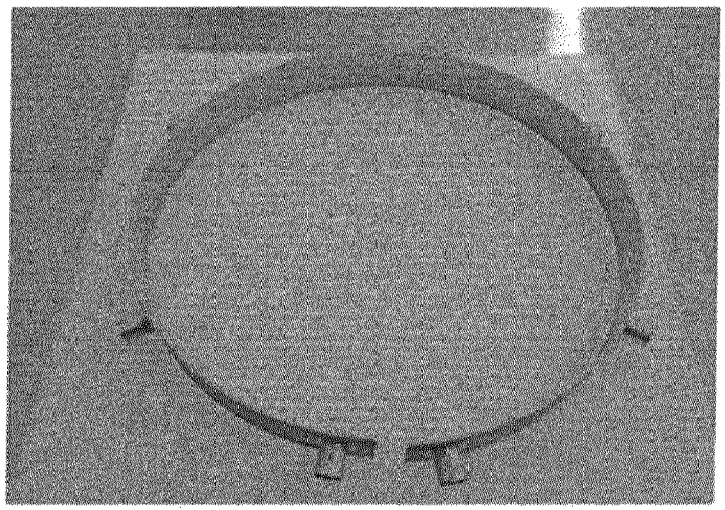
FIG. 1 This includes an exterior photo (A) showing the coil of Example 1 that was subject to the cutting-type knurling, and an exterior photo (B) showing the surface of this coil.
Figure 1:
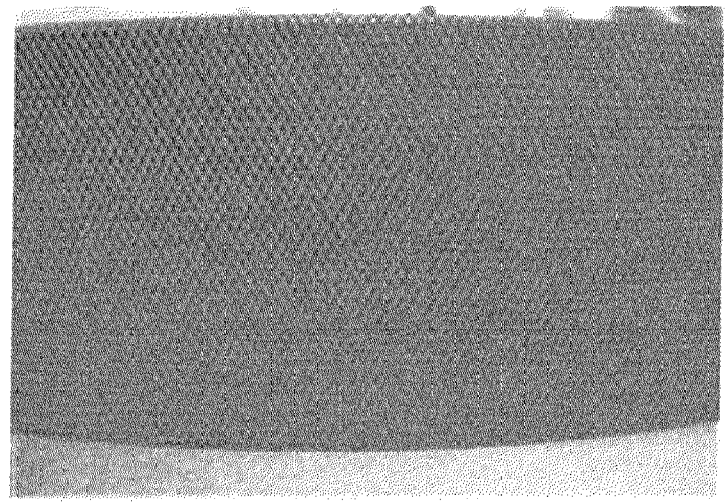

With a sputtering device in which a tantalum coil is disposed between a substrate and a sputtering target, for instance, if a tantalum target is used, the grains that are sputtered from the tantalum target will become deposited and accumulated on the wafer and also on the surface of the tantalum coil around the target. Moreover, the coil is exposed to heat and expands during sputtering.

When the accumulation thickness on the surface of the coil increases, the film will flake due to stress increase, and such film flakes will scatter and adhere onto the substrate, and cause the generation of particles or arcing.

In order to prevent the foregoing problem, conventionally, knurling was performed to the coil so as to roughen the surface and increase the peeling resistance. Knurling is a process of forming irregularities by strongly pressing a knurling tool against the work, but there is a limit to the roughness that can be formed since tantalum is hard.

Thus, when the deposited film is accumulated to a certain degree, there is a problem in that the peeling of the film will occur in a relatively short period of time. In order to improve the quality of the thin film, it is necessary to stop the sputtering operation and replace the coil, and this caused the deterioration in the production efficiency.

Moreover, even when knurling is performed, there was a problem in that it was unclear about what extent the irregularities need to be formed on the surface so as to prevent the flaking of the sputtered grains from the surface of the coil.

Generally speaking, a thin material is used for the coil, and in certain cases a material having a thickness of roughly 5 mm is used. Thus, if strong knurling is performed, there are cases where the coil itself will deform. On the other hand, if weak knurling is performed, the roughening will be insufficient.

In the present invention, numerous tests were conducted to examine the foregoing point, and the optimal conditions were discovered by changing the method of knurling and the strength of knurling.

Consequently, it was discovered that the peeling of the deposited film can be dramatically prevented by performing knurling to a tantalum coil, which is disposed between a substrate and a sputtering target, in order to form irregularities so that the surface roughness Rz of the tantalum coil is 150 μm or more and the number of threads is 15 to 30 TPI in a transverse direction and 10 to 30 TPI in a vertical direction. There are two types of knurling processes; namely, cutting-type knurling and pressing-type knurling; and either knurling process may be applied by suitably setting the conditions.

The present invention is to provide a tantalum coil for sputtering obtained as described above. Even if one of the foregoing conditions is not met, it is not possible to prevent the flaking of the sputtered grains from the surface of the coil, and it is not possible to achieve the object of the present invention.

In addition, the surface roughness Rz is preferably 200 μm or more. It is thereby possible to roughen the irregularities and attain strong adhesion. Moreover, more preferably, the thread crest R is 10 to 500 μm or the thread crest is provided with a flat having a width of 10 to 500 µm (this size can also be referred to as the "diameter"). The tantalum coil for sputtering of the present invention provides technology which covers the foregoing aspects.

The thickness, width, and length of the coil can be arbitrarily changed based on the design of the sputtering device, and it should also be easy to understand that the coil can be arbitrarily designed to be provided in multiple stages or in a spiral shape, since these are issues related to the design of the sputtering device.

EXAMPLES

The Examples are now explained. Note that these Examples are described for facilitating the understanding of the present invention, and are not intended to limit the present invention in any way. In other words, other examples and modifications within the scope of the technical concept of the present invention are covered by the present invention.

Example 1

Cutting-type knurling was performed to prepare a tantalum coil in which the surface roughness Rz is 250 µm, the number of threads is 20 TPI (Threads per inch) in a transverse direction and 13 TPI in a vertical direction, and the thread crest R is 100 µm.

FIG. 1 includes an exterior photo (A) showing the coil of Example 1 that was subject to the cutting-type knurling, and an exterior photo (B) showing the outside (outer surface) of this coil. Moreover, FIG. 2 includes an SEM photo (A) showing the surface of the coil of Example 1 that was subject to the cutting-type knurling, and an SEM photo (B) showing the surface of this coil in a depth direction (cross section).

Figure 2:
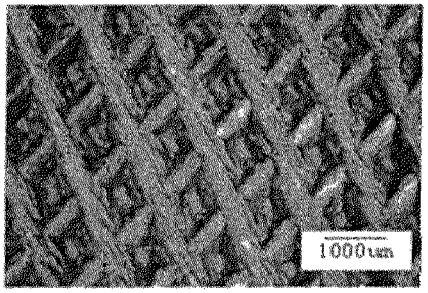
FIG. 2 This includes an SEM photo (A) showing the surface of the coil of Example 1 that was subject to the cutting-type knurling, and an SEM photo (B) showing the surface of this coil in a depth direction (cross section).
Figure 2:
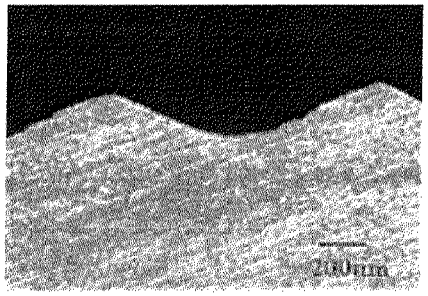

As shown in FIG. 1 and FIG. 2, even though a tantalum coil was used, the unevenness of the irregularities was large and the irregularities were distinct, and therefore the stronger adhesion of the deposited film on the surface of the tantalum coil was enabled.

Moreover, when sputtering was performed using this tantalum coil, the coil had conventionally needed to be replaced after the use of 200 kWh, but the tantalum coil of Example 1 could be used up to 350 kWh. It was thereby possible to yield a considerable effect.

Example 2

Cutting-type knurling was performed to prepare a tantalum coil in which the surface roughness Rz is 150 µm, the number of threads is 20 TPI in a transverse direction and 13 TPI in a vertical direction, and the thread crest R is 220 µm. Even though a tantalum coil was used, the unevenness of the irregularities was large and the irregularities were distinct, and therefore the stronger adhesion of the deposited film on the surface of the tantalum coil was enabled.

Moreover, when sputtering was performed using this tantalum coil, the coil had conventionally needed to be replaced after the use of 200 kWh, but the tantalum coil of Example 2 could be used up to 300 kWh. It was thereby possible to yield a considerable effect. However, the use-life was shorter since the surface roughness Rz of the coil was smaller in comparison to Example 1.

Example 3

Cutting-type knurling was performed to prepare a tantalum coil in which the surface roughness Rz is 300 µm, the number of threads is 20 TPI in a transverse direction and 13 TPI in a vertical direction, and the thread crest R is 5 µm. Even though a tantalum coil was used, the unevenness of the irregularities was large and the irregularities were distinct, and therefore the stronger adhesion of the deposited film on the surface of the tantalum coil was enabled.

Moreover, when sputtering was performed using this tantalum coil, the coil had conventionally needed to be replaced after the use of 200 kWh, but the tantalum coil of Example 3 could be used up to 300 kWh. It was thereby possible to yield a considerable effect.

However, since the thread crest R was slightly small, the deposited film started to flake at the thread crest after 300 kWh.

Example 4

Pressing-type knurling was performed to prepare a tantalum coil in which the surface roughness Rz is 250 µm, the number of threads is 18 TPI in a transverse direction and 18 TPI in a vertical direction, and the width of the flat positioned on the thread crest is 200 µm.

Figure 5:
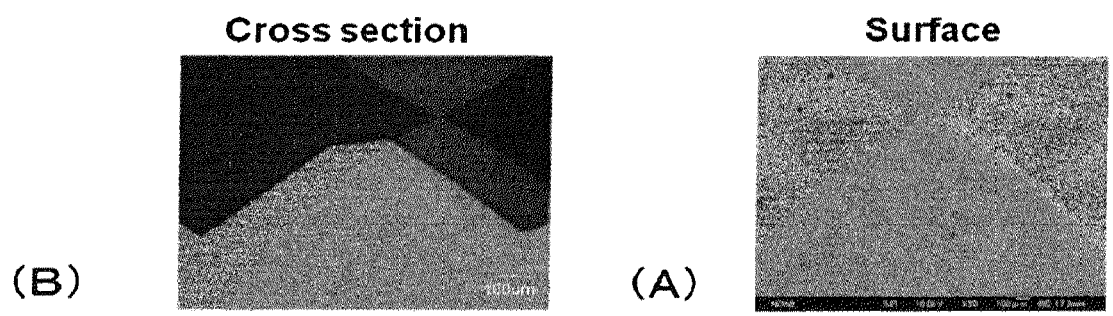
FIG. 5 This includes an SEM photo (A) showing the surface of the coil of Example 4 that was subject to the pressing-type knurling, and an SEM photo (B) showing the surface of this coil in a depth direction (cross section).

FIG. 5 includes an SEM photo (A) showing the surface of the coil of Example 4 that was subject to the pressing-type knurling, and an SEM photo (B) showing the surface of this coil in a depth direction (cross section). Though the thread crest was flat in this case, it could also be processed to have R of 10 to 500 µm.

As shown in FIG. 5, even though a tantalum coil was used, the unevenness of the irregularities was large and the irregularities were distinct, and therefore the stronger adhesion of the deposited film on the surface of the tantalum coil was enabled.

Moreover, when sputtering was performed using this tantalum coil, the coil had conventionally needed to be replaced after the use of 200 kWh, but the tantalum coil of Example 4 could be used up to 350 kWh. It was thereby possible to yield a considerable effect.

Comparative Example 1

Pressing-type knurling was performed to prepare a tantalum coil in which the surface roughness Rz is 80 µm, the number of threads is 80 TPI in a transverse direction and 32 TPI in a vertical direction, and the thread crest R is 200 µm.

Figure 3:
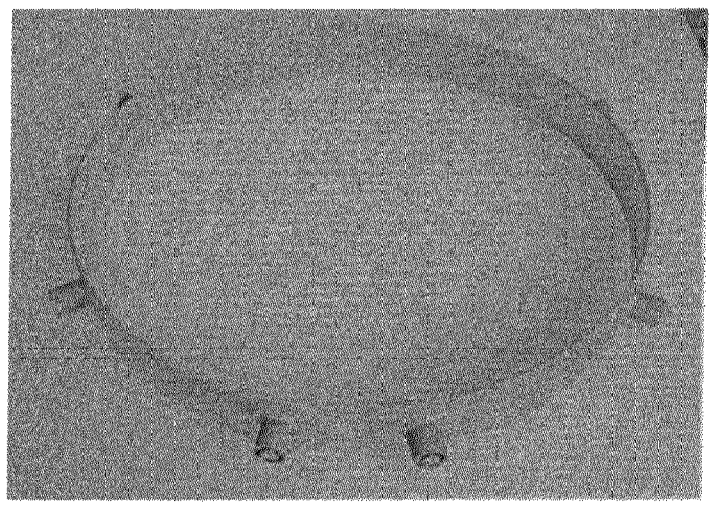
FIG. 3 This includes an exterior photo (A) showing the coil of Comparative Example 1 that was subject to the knurling, and an exterior photo (B) showing the surface of this coil.
Figure 3:
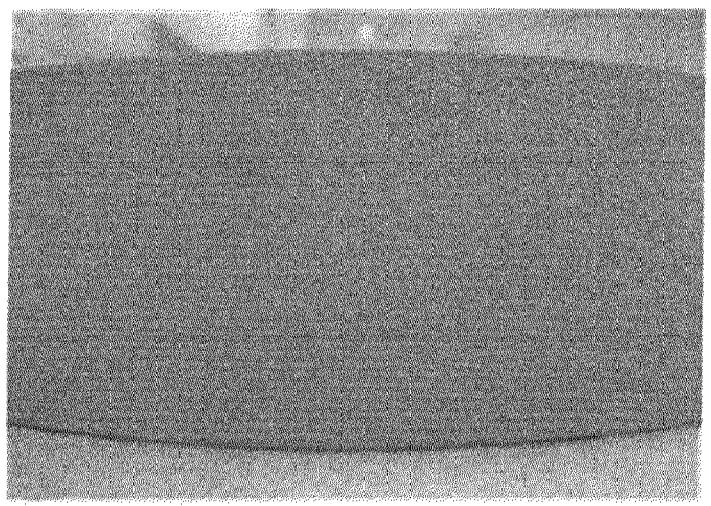

FIG. 3 includes an exterior photo (A) showing the coil of Comparative Example 1 that was subject to the knurling, and an exterior photo (B) showing the surface of this coil. Moreover, FIG. 4 includes an SEM photo (A) showing the surface of the coil of Comparative Example 1 that was subject to the pressing-type knurling, and an SEM photo (B) showing the surface of this coil in a depth direction (cross section).

Figure 4:
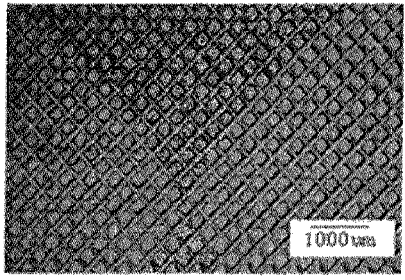
FIG. 4 This includes an SEM photo (A) showing the surface of the coil of Comparative Example 1 that was subject to the knurling, and an SEM photo (B) showing the surface of this coil in a depth direction (cross section).
Figure 4:
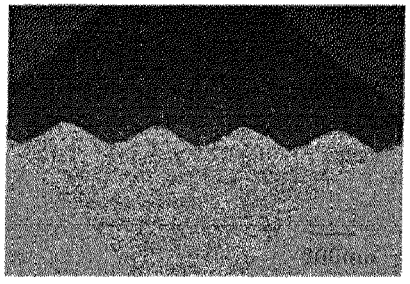

As shown in FIG. 3 and FIG. 4, the unevenness of the irregularities on the surface of the tantalum coil was small, and the stronger adhesion of the deposited film on the surface of the tantalum coil could not be achieved.

When sputtering was performed using this tantalum coil, the coil needed to be replaced after the use of 200 kWh.

Comparative Example 2

Pressing-type knurling was performed to prepare a tantalum coil in which the surface roughness Rz is 20 µm, the number of threads is 80 TPI in a transverse direction and 32 TPI in a vertical direction, and the thread crest R is 550 µm. The unevenness of the irregularities on the surface of the tantalum coil was small, and the stronger adhesion of the deposited film on the surface of the tantalum coil could not be achieved. When sputtering was performed using this tantalum coil, the coil needed to be replaced after the use of 100 kWh.

The present invention is able to effectively prevent the sputtered grains accumulated on the surface of a tantalum coil from flaking so as to prevent the generation of particles and arcing that is caused by the flaking of the sputtered grains accumulated on the surface of the coil disposed between a substrate and a sputtering target, and the adhesion of the scattered flakes onto the substrate surface; and to provide a technology of improving the quality and productivity of electronic components and stably providing semiconductor elements and devices. Therefore, the present invention is applicable for a sputtering device in which a tantalum coil is used.

The invention claimed is:

1. A tantalum coil for sputtering disposed between a substrate and a tantalum sputtering target and having an inner and an outer circumferential surface, wherein the tantalum coil has irregularities including threads formed on the inner and outer circumferential surfaces so that the surface roughness Rz of the inner and outer circumferential surfaces of the tantalum coil is 200 μm or more and 300 μm or less and the number of threads is 15 to 30 TPI in a transverse direction and 10 to 30 TPI in a vertical direction, and wherein a thread crest R of the threads is 10 to 500 μm or the thread crest is provided with a flat having a width of 10 to 500 μm.

2. The tantalum coil for sputtering according to claim 1, wherein the surface roughness Rz is 250 μm or more and 300 μm or less.

3. A method for processing a tantalum coil for sputtering, wherein irregularities including threads are formed on inner and outer circumferential surfaces of a tantalum coil by performing knurling to the tantalum coil disposed between a substrate and a tantalum sputtering target so that the surface roughness Rz of the inner and outer circumferential surfaces of the tantalum coil is 200 μm or more and 300 μm or less and the number of threads is 15 to 30 TPI in a transverse direction and 10 to 30 TPI in a vertical direction, and wherein a thread crest R of the threads is 10 to 500 μm or the thread crest is provided with a flat having a width of 10 to 500 μm.

4. The method for processing a tantalum coil for sputtering according to claim 3, wherein the surface roughness Rz is 250 μm or more and 300 μm or less.

* * * * *